US 9,384,950 B2

(12) United States Patent
Duan et al.

(10) Patent No.: US 9,384,950 B2
(45) Date of Patent: Jul. 5, 2016

(54) CHAMBER COATINGS

(71) Applicant: Applied Materials, Inc., Santa Clara, CA (US)

(72) Inventors: Ren-Guan Duan, Fremont, CA (US); Juan Carlos Rocha-Alvarez, San Carlos, CA (US); Jianhua Zhou, Campbell, CA (US); Ningli Liu, Cupertino, CA (US); Yihong Chen, San Jose, CA (US); Abhijit Basu Mallick, Fremont, CA (US); Sudhir R. Gondhalekar, Pleasanton, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/601,274

(22) Filed: Jan. 21, 2015

(65) Prior Publication Data

US 2015/0221480 A1    Aug. 6, 2015

Related U.S. Application Data

(60) Provisional application No. 62/025,613, filed on Jul. 17, 2014, provisional application No. 61/934,560, filed on Jan. 31, 2014.

(51) Int. Cl.
  *C04B 35/00* (2006.01)
  *H01J 37/32* (2006.01)
  *C09D 1/00* (2006.01)

(52) U.S. Cl.
  CPC ............ *H01J 37/32477* (2013.01); *C09D 1/00* (2013.01); *H01J 37/32467* (2013.01)

(58) Field of Classification Search
  CPC .......... C04B 35/14; C04B 35/18; C10B 29/02
  USPC ........ 501/64, 68, 69, 72, 119, 122, 128, 133, 501/152, 153, 154
  See application file for complete search history.

(56) References Cited

U.S. PATENT DOCUMENTS

| | | | | |
|---|---|---|---|---|
| 6,265,334 | B1 * | 7/2001 | Sechi | C04B 35/195 257/E23.009 |
| 6,447,937 | B1 * | 9/2002 | Murakawa | C04B 35/18 428/446 |
| 6,942,929 | B2 * | 9/2005 | Han | C23C 16/4404 118/500 |
| 7,501,090 | B2 * | 3/2009 | Bangaru | C22C 29/12 419/5 |
| 8,334,062 | B1 * | 12/2012 | Pujari | C04B 41/009 428/446 |

(Continued)

FOREIGN PATENT DOCUMENTS

JP    2004-190136 A    7/2004

OTHER PUBLICATIONS

PCT Notification of Transmittal of the International Search Report and the Written Opinion of the International Searching Authority for International Application No. PCT/US2015/012304 dated Apr. 29, 2015; 10 total pages.

*Primary Examiner* — Noah Wiese
(74) *Attorney, Agent, or Firm* — Patterson & Sheridan, LLP (57) ABSTRACT

In one embodiment, a processing chamber is disclosed wherein at least one surface of the processing chamber has a coating comprising $Si_vY_wMg_xAl_yO_z$, wherein v ranges from about 0.0196 to 0.2951, w ranges from about 0.0131 to 0.1569, x ranges from about 0.0164 to 0.0784, y ranges from about 0.0197 to 0.1569, z ranges from about 0.5882 to 0.6557, and v+w+x+y+z=1.

17 Claims, 11 Drawing Sheets

(56) References Cited

U.S. PATENT DOCUMENTS

| | | |
|---|---|---|
| 2003/0127049 A1 | 7/2003 | Han et al. |
| 2006/0019103 A1* | 1/2006 | Abe .................. C03C 3/062 428/426 |
| 2008/0076657 A1 | 3/2008 | Komeya et al. |
| 2008/0213617 A1 | 9/2008 | Taylor et al. |
| 2012/0100982 A1* | 4/2012 | Sugawara ............ C04B 35/195 501/152 |
| 2012/0125488 A1 | 5/2012 | Sun et al. |

* cited by examiner

| AsMy COATING ON AlN | AsMy COATING ON Al | Y2O3 COATING ON Al |

| AsMy COATING ON AlN | AsMy COATING ON Al | Y2O3 COATING ON Al |
|---|---|---|
|  |  |  |
| *Fig. 5A* | *Fig. 5D* | *Fig. 5G* |
|  |  |  |
| *Fig. 5B* | *Fig. 5E* | *Fig. 5H* |
|  |  |  |
| *Fig. 5C* | *Fig. 5F* | *Fig. 5I* |

As - SPRAYED     POST 900C TREATED     POST 1100C TREATED

As - SPRAYED      POST 900C TREATED      POST 1100C TREATED

CHAMBER COATINGS

CROSS-REFERENCE TO RELATED APPLICATIONS

This application claims benefit of U.S. Provisional Patent Application Ser. No. 61/934,560 filed Jan. 31, 2014, and U.S. Provisional Patent Application Ser. No. 62/025,613 filed Jul. 17, 2014. Both of the aforementioned applications are hereby incorporated by reference herein.

BACKGROUND

1. Field

Embodiments of the present disclosure generally relate to a coating and a method of using a coating to improve chamber performance.

2. Description of the Related Art

The rate at which semiconductor fabrication plants (FABS) process semiconductor substrates (i.e., wafers) is important to the viability and profitability of companies in the semiconductor industry. A common problem reducing substrate processing rates, or throughput, is that processing chamber performance diminishes as the total operational run-time of that processing chamber increases. An increase in the processing time of even a single chamber adds unpredictability into the operations of the FAB, which may lead to bottlenecks in processing. Improvements in chamber cleaning methods have mitigated the deterioration of chamber performance somewhat, but the improvement is not sufficient for current throughput demands.

Therefore, what is needed is a method to prevent decreases in processing chamber performance over time.

SUMMARY

Embodiments of the disclosure are directed to a composition of matter, a processing chamber coated with the composition of matter, and a method of processing a substrate that prevents the decrease of chamber performance over time.

In one embodiment, a processing chamber is disclosed wherein at least one surface of the processing chamber has a coating comprising $Si_vY_wMg_xAl_yO_z$, wherein v ranges from about 0.0196 to 0.2951, w ranges from about 0.0131 to 0.1569, x ranges from about 0.0164 to 0.0784, y ranges from about 0.0197 to 0.1569, z ranges from about 0.5882 to 0.6557, and v+w+x+y+z=1.

In another embodiment, a composition of matter is disclosed having a molecular structure comprising $Si_vY_wMg_xAl_yO_z$, wherein v ranges from about 0.0196 to 0.2951, w ranges from about 0.0131 to 0.1569, x ranges from about 0.0164 to 0.0784, y ranges from about 0.0197 to 0.1569, z ranges from about 0.5882 to 0.6557, and v+w+x+y+z=1.

In another embodiment, a method of processing a substrate is disclosed. The method comprises generating a plasma or radicals inside a processing chamber or introducing a plasma or radicals into a processing chamber, wherein the processing chamber has at least one surface coated with $Si_vY_wMg_xAl_yO_z$, wherein v ranges from about 0.0196 to 0.2951, w ranges from about 0.0131 to 0.1569, x ranges from about 0.0164 to 0.0784, y ranges from about 0.0197 to 0.1569, z ranges from about 0.5882 to 0.6557, and v+w+x+y+z=1.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

The descriptions of the various embodiments of the present disclosure have been presented for purposes of illustration, but are not intended to be exhaustive. Many modifications and variations will be apparent to those of ordinary skill in the art without departing from the scope and spirit of the described embodiments. The terminology used herein was chosen to best explain the principles of the embodiments, the practical applications or technical improvements over technologies found in the marketplace, or to enable others of ordinary skill in the art to understand the embodiments disclosed herein.

Embodiments of the disclosure are directed to a composition of matter, a processing chamber component coated with the composition of matter, and a method of processing a substrate that prevents a decrease of chamber performance over time. The composition of matter has a molecular structure that includes $Si_vY_wMg_xAl_yO_z$. The processing chamber comprises at least one surface that is coated with the composition of matter having the molecular structure that includes $Si_vY_wMg_xAl_yO_z$. In the molecular structure, v ranges from about 0.0196 to 0.2951; w ranges from about 0.0131 to 0.1569; x ranges from about 0.0164 to 0.0784; y ranges from about 0.0197 to 0.1569; and z ranges from about 0.5882 to 0.6557, wherein v+w+x+y+z=1 (excluding impurities). The coated surface may be, for example, a surface that is exposed to a plasma, radicals, or both during the operation of the chamber. The method of processing the substrate includes generating a plasma or radicals inside a processing chamber or introducing a plasma or radicals into a processing chamber, wherein the processing chamber has at least one surface coated with $Si_vY_wMg_xAl_yO_z$. In the coating, v ranges from about 0.0196 to 0.2951; w ranges from about 0.0131 to 0.1569; x ranges from about 0.0164 to 0.0784; y ranges from about 0.0197 to 0.1569; and z ranges from about 0.5882 to 0.6557. The coated surface may be, for example, a surface that is exposed to plasma, radicals, or both during the operation of the chamber. The $Si_vY_wMg_xAl_yO_z$ coatings on processing chamber surfaces may substantially reduce, if not eliminate, the decrease of chamber performance over time.

Processing chamber material directly contacting plasma and/or radicals generated in a processing chamber is important for high quality thin film preparation. Generally, the chamber surfaces that contact plasma and/or radicals are composed of silica or aluminum, both of which consume hydrogen radicals that may be generated in a plasma process, leaving fewer hydrogen radicals to carry out the intended process. Although not to be limited by theory, it is believed that in conventional cleaning processes, aluminum surfaces are transformed into aluminum fluoride, and then in a process involving hydrogen radicals, the hydrogen radicals convert the aluminum fluoride to aluminum hydride. As total chamber run time increases, the surface layer of aluminum fluoride grows thicker, resulting in an even more dramatic drop in processing rate.

Processing chamber surfaces coated with a composition having a molecular structure including aluminum oxide, silicon, magnesium and yttrium, hereinafter a "AsMy" coating, consume substantially fewer, if any, hydrogen radicals as compared to conventional surfaces. Accordingly, coating the surfaces of a processing chamber that are exposed to plasma and/or radicals, such as hydrogen radicals, with AsMy improves chamber performance and enables the formation of high quality films. AsMy coatings on processing chamber surfaces may substantially reduce, if not eliminate, the decrease of chamber performance over time. Additionally, coating chamber surfaces with AsMy improves the plasma erosion resistance of the inner surfaces of the processing chamber.

In one embodiment, AsMy is prepared according to the following process. Raw powders of $Al_2O_3$ $SiO_2$, MgO, and $Y_2O_3$ are thoroughly mixed together using a ball milling process. The raw powders have a purity of at least 98%, or greater, for example, a purity of about 99.9%. Size of the raw powders may be between about 10 nanometers (nm) to about 100 microns (µm), such as about 5 µm to about 15 µm, for example about 10 µm. The weight ratio of the water:powder:

ball may be about 1:1:2. The mixtures of $Al_2O_3$ $SiO_2$, MgO, and $Y_2O_3$ may have the following proportions, in terms of molar percent: $SiO_2$: 10-90%; $Y_2O_3$: 2-50%; MgO: 5-40%; and $Al_2O_3$: 3-40%. For instance, the proportions may be, in terms of molar percent: $SiO_2$: 20-60%; $Y_2O_3$: 8-25%; MgO: 12-25%; and $Al_2O_3$: 10-35%. In a specific example, the mixing proportions may be 56.8 molar % $SiO_2$, 10.2 molar % $Y_2O_3$; 18 molar % MgO; and 15.0 molar % $Al_2O_3$. In another representative example, the mixing proportions may be 90.0 molar % $SiO_2$, 2.0 molar % $Y_2O_3$, 5.0 molar % MgO, and 3.0 molar % $Al_2O_3$. In another embodiment, the mixing proportions may be 10% $SiO_2$, 50% $Y_2O_3$, 20% MgO, and 20% $Al_2O_3$. After the raw powders are thoroughly mixed, the mixture may be melted at a temperature ranging from about 1400° C. to about 1800° C. for about 120 minutes. The melted mixture of raw powders may then be quenched to air/water form an AsMy glass.

The AsMy glass may then be crushed into small particles. The small particles may range in size from about 100 nm to about 10 µm. The crushed AsMy may then be mixed with a binder. The binder may be, for example, polyvinyl alcohol (PVA). The binder is then dissolved into deionized water to make a solution. In one example, the mass ratio of binder to water is 3:97. The crushed AsMy to solution ratio may be from about 20:100 to about 45:100, such as 30:100. After the solution and the AsMy glass powders are mixed together, the mixture is spray dried to generate granular particles. The granular particles may range in size from about 20-50 µm. In one embodiment, the D 50 particle size distribution (i.e., the median value of particle diameter at 50% in the cumulative distribution) is about 30 µm.

In another embodiment, AsMy is prepared according to a melting and quenching process. Raw powders of $Al_2O_3$ $SiO_2$, MgO, and $Y_2O_3$ are thoroughly mixed and placed in a quartz crucible. The mixed powders are heated to about 1,500 degrees Celsius. The crucible may be heated using a heater or plasma may be used to heat the powders. The melt is then quenched to provide pieces which are ball milled to make granular particles. The particles are then spray dried (with or without a binder). In one embodiment, the D 50 particle size distribution of the granular particles is about 30 µm.

In the embodiments above, substantially round particles are produced. However, in another embodiment, non-symmetrical or irregular particles may be produced. Producing the irregular particles is similar to the process above with the exception of screening the particles after ball milling, and the spray drying process is omitted. After milling, the particles may be screened. In one embodiment, the D 50 particle size distribution of the irregular particles is about 30 µm. In another embodiment, the D 50 particle size distribution of the irregular particles is about 45 µm.

The particles may be applied to a processing chamber component by a thermal spraying process, such as by a plasma spraying process. The AsMy coating may be glass (amorphous solid) or glass-ceramic (a material having an amorphous phase and one or more crystalline phases). To get a glass AsMy coating, component temperature may be less than 150° C., and/or the working distance between the component and the plasma gun will be greater than when making a glass-ceramic coating. To get a glass-ceramic AsMy coating, component temperature may be greater than 400° C. and/or the working distance between the component and plasma gun may be at lesser distance than when making a glass coating.

During the plasma spraying process, the component temperature may be maintained at approximately 150° C. for amorphous AsMy coatings and approximately 450° C. for glass-ceramic coatings on ceramic components. The AsMy coating may be applied until it has a thickness of about 20-300 um, such as 100-250 um, for example 200 um. The AsMy coating may be applied directly to the processing chamber component or as a layer, such as a coating, deposited on a surface of the processing chamber component.

Table 1 includes exemplary parameters for a thermal spraying process to coat a processing chamber component.

TABLE 1

| Item | Unit | Range |
| --- | --- | --- |
| Power of Plasma | kW | 50-90 |
| Power Current | A | 100-160 |
| Power Voltage | V | 260-310 |
| Powder Feed Rate | g/minute | 5-100 |
| Distance | mm | 60-150 |
| Gun moving Speed | mm/second | 600-3000 |
| Gun Angle | degree | 45-90 |
| Gun Air-Blow Angle | degree | 45-90 |
| Plasma Gas (Ar) | L/minute | 0-100 |
| Plasma Gas (O2) | L/minute | 0-100 |
| Temp of Substrate | degree C. | 25-300 |
| Total Thickness | μm | 20-300 |
| Thickness per pass | μm/pass | 1-100 |
| Surface Roughness | μm | 1-10 |

The final coatings may include the following molecular structure, $Si_vY_wMg_xAl_yO_z$, wherein v ranges from about 0.0196 to about 0.2951, w ranges from about 0.0131 to about 0.1569, x ranges from about 0.0164 to about 0.0784, y ranges from about 0.0197 to about 0.1569, and z ranges from about 0.5882 to about 0.6557. For example, v may range from about 0.0393 to about 0.118; w may range from about 0.0213 to about 0.0634; x may range from about 0.0119 to about 0.0356; y may range from about 0.0221 to about 0.0663; and z may range from about 0.155 to about 0.466. For example, the molecular structure may be $Si_{0.171}Y_{0.062}Mg_{0.054}Al_{0.090}O_{0.623}$ or approximately $Si_{0.171}Y_{0.062}Mg_{0.054}Al_{0.090}O_{0.623}$. In another embodiment, the molecular structure may be approximately $Si_4Y_2Mg_2Al_3O_{14}$.

Surfaces that may be coated with AsMy include any surface of a processing chamber component, such as surfaces that may be exposed to plasma and/or radicals that may degrade the coating and/or the underlying material. Radicals include hydrogen radicals or fluorine radicals that are generated inside of or introduced into the processing chamber. Hydrogen radicals may be generated by a plasma, by a hot wire chemical vapor deposition apparatus, or by other suitable means. Fluorine radicals may be generated in, or introduced into, the processing chamber during a chamber cleaning process. In some embodiments, the plasma sprayed AsMy coatings may be thermally treated to enhance properties of the coating.

As used herein, a "processing chamber component" includes the walls of the chamber, any components contained within the processing chamber, such as, for example a showerhead, a baffle, a blocker plate, and a substrate support, and any components coupled to the chamber, such as, for example, a remote plasma source system, a gas delivery system, and a vacuum system. Representative processing surfaces that may benefit from an AsMy coating are illustrated in relation to FIG. 1.

Figure 1:
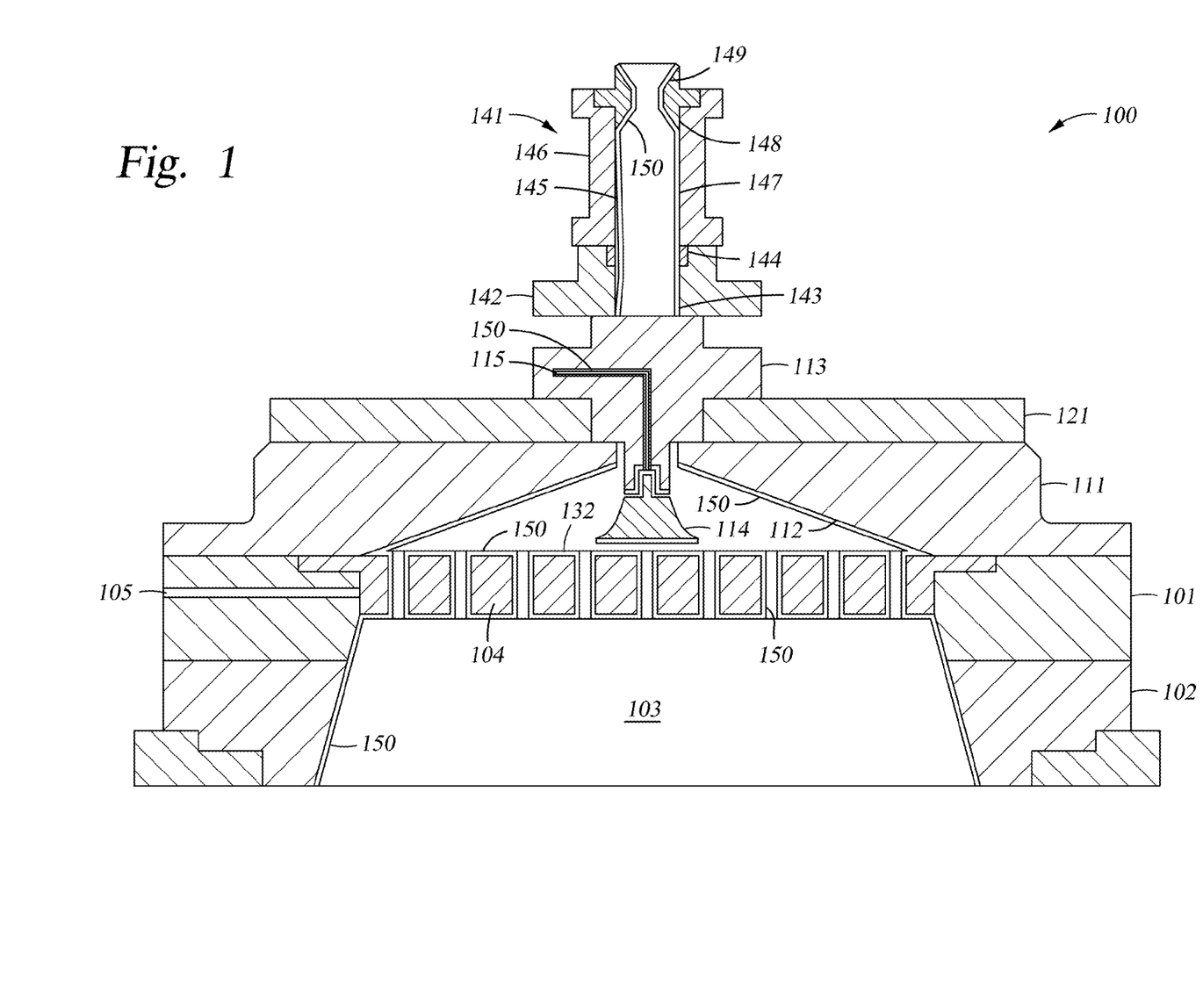
FIG. 1 is a schematic cross sectional view of a processing chamber that may benefit from embodiments disclosed herein.

FIG. 1 is a cross-sectional view of a flowable chemical vapor deposition chamber 100 that has surfaces that may benefit from an AsMy coating. Although a flowable chemical vapor deposition chamber is illustrated, embodiments of the disclosure are applicable to any chamber, such as, for example, chemical vapor deposition chambers, etch chambers, physical vapor deposition chambers, and atomic layer deposition chambers. Chamber 100 has a chamber body 101, a dome 111, a backing plate 121, and a remote plasma source system 141. The chamber body 101 has chamber body side walls 102 and a process volume 103. The sidewalls 102 include the interior surfaces of the chamber body 101. The process volume 103 is the volume bounded by a dual channel showerhead 104 and the sidewalls 102. A substrate support (not shown) upon which a substrate (also not shown) may rest as it is processed may be positioned within the process volume 103.

The chamber body 101 the dual channel showerhead 104. Dual channel showerhead 104 has two sets of apertures configured to allow two sets of chemistries to travel into process volume 103 without interacting with each other inside the dual channel showerhead. Dual channel showerhead 104 may be coupled to one or more gas sources (not shown) through gas inlet 105. Gas inlet 105 may introduce gases into the process volume 103 through one set of apertures of dual channel showerhead 104. Plasma and other reactive species may enter the process volume 103 through the second set of apertures of the dual channel showerhead 104. The terms "gas" and "gases" are used interchangeably, unless otherwise noted, and refer to one or more precursors, reactants, catalysts, carrier, purge, cleaning, combinations thereof, as well as any other fluid introduced into the processing chamber 100, such as into the process volume 103.

Dome 111 is positioned above the dual channel showerhead 104 and is coupled to the chamber body 101. Dome 111 provides a volume that may receive gases and plasma, such as a hydrogen-containing plasma, or a fluorine-containing plasma from the remote plasma source system 141. Dome 111 includes dome sidewalls 112 and a baffle 114. The baffle 114 is positioned above and not in contact with the dual channel showerhead 104. The baffle 114 diffuses the gas and plasma that exits the gas feed block 113.

Gas feed block 113 may protrude into the dome 111 from the backing plate 121 and is coupled on one surface to the remote plasma source system 141 and on another surface to backing plate 121. Backing plate 121 is positioned above and coupled to the dome 111. Gas feed block 113 has an interior surface 115 which contacts the gases and plasma as the gases and plasma travel through the gas feed block 113.

Remote plasma source system 141 includes a remote plasma source (not shown), a choker 148, a remote plasma conduit 146, a centering ring 144, and a remote plasma source bracket 142. A remote plasma source generates a remote plasma, which is a plasma produced in a region separated from the processing region, such as process volume 103. The remote plasma source may couple on one end to choker 148 and on another end to a surface of the remote plasma source bracket 142 that is not shown. The choker 148 has an interior surface 149. The choker 148 couples to remote plasma conduit 146. Remote plasma conduit 146 has an interior surface 147. The remote plasma conduit delivers the remotely-formed plasma from the remote plasma source to the centering ring 144. Remote plasma conduit 146 couples to centering ring 144. Centering ring 144 has an interior surface 145. The centering ring 144 aligns the remotely-formed plasma exiting from remote plasma conduit 146 with the interior surface of the gas feed block 113 so that plasma can be delivered to the volume of dome 111. Centering ring 144 couples to remote plasma source bracket 142. Remote plasma source bracket 142 has an interior surface 143. Remote plasma source bracket 142 provides structural support for the remote plasma source.

When chamber 100 is in operation, plasma from the remote plasma source and radicals generated by the plasma travel through choker 148, remote plasma conduit 146, centering ring 144, remote plasma source bracket 142, and gas feed block 113 and into the dome 111, where they contact baffle 114 before travelling through dual channel showerhead 104 and into the process volume 103. As the plasma and radicals travel from the remote plasma source to the process volume 103, the plasma and radicals contact the interior surface 149 of the choker 148, the interior surface 147 of the remote plasma conduit 146, the interior surface 145 of the centering ring 144, the interior surface 143 of the remote plasma source bracket 142, and the interior surface 115 of gas feed block 113, and into the dome 111, where they contact dome sidewalls 112, baffle 114, and a top surface 132 of the dual channel showerhead 104 as well as the apertures of the dual channel showerhead 104, before travelling through dual channel showerhead 104 and into the process volume 103, where the plasma and radicals may contact the sidewalls 102 of the chamber body 101 and may contact the bottom surface of the dual channel showerhead 104.

All chamber surfaces that may contact the plasma and radicals generated inside or introduced into a processing chamber may benefit from an AsMy coating. The AsMy coating as described herein may be used on a variety of materials including, but not limited to, aluminum (Al), ceramics and graphite. In the representative example of FIG. 1, at least the sidewalls 102, the top and bottom surfaces, as well as the apertures, of dual channel showerhead 104, the baffle 114, the interior surface 115 of the gas feed block 113, the interior surface 143 of the remote plasma source bracket 142, the interior surface 145 of the centering ring 144, the interior surface 147 of the remote plasma conduit 146, and the interior surface 149 of the choker 148 may benefit from an AsMy coating, shown as coating 150. Different processing chambers may have different surfaces that benefit from the AsMy coating. For example, a chamber having a single channel showerhead or a blocker plate would benefit from coating the single channel showerhead and/or the blocker plate with AsMy. A blocker plate may be included between a gas source and a gas distribution plate to assist in distribution of gases. A blocker plate may include a plurality of spaced-apart holes that aid in distributing the gases prior to passing through the gas distribution plate. As an additional representative example, a chamber having a different remote plasma source system configuration would have different remote plasma source system components that would benefit from an AsMy coating (e.g., the coating 150).

Figure 2:
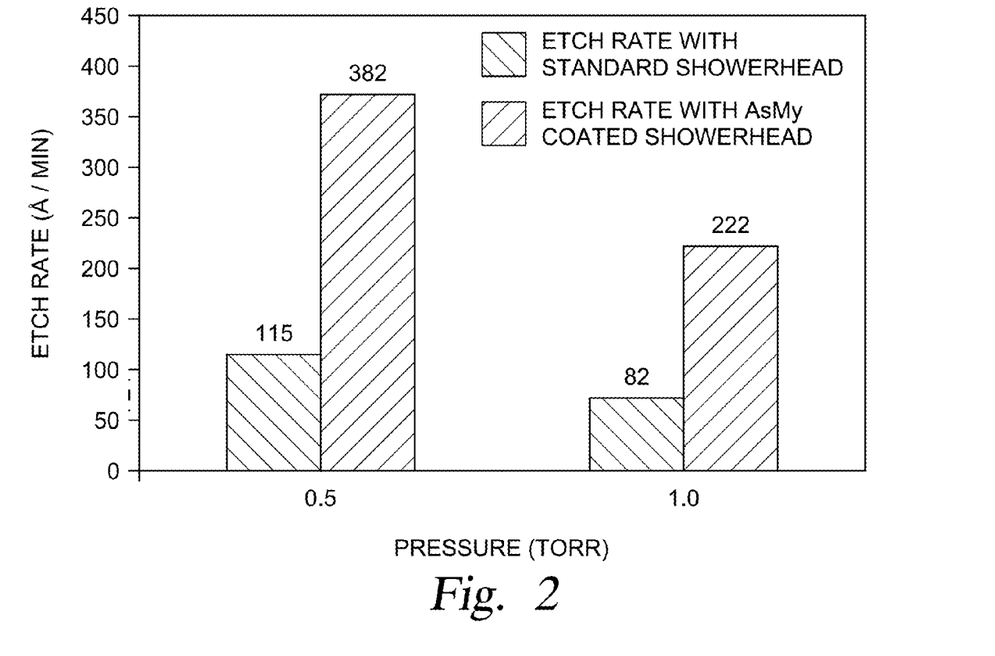
FIG. 2 is a graph comparing the etch rates of a carbon film in a processing chamber having a showerhead coated with an AsMy coating (i.e., an aluminum oxide/silicon/magnesium/yttrium coating) and in a processing chamber having an uncoated showerhead.

FIG. 2 is a graph 200 showing an increase in processing chamber performance when only a single surface of a processing chamber is coated with AsMy (e.g., the coating 150). The etch rate of a carbon film in a processing chamber equipped with a remote plasma source and a dual channel showerhead 104 that has the top surface 132 coated with AsMy was compared to the etch rate of a carbon film in a chamber equipped with an uncoated dual channel showerhead. The comparison was performed at pressures of 0.5 Torr and 1.0 Torr. In all cases, the etching was performed in a pure hydrogen plasma wherein the hydrogen gas was supplied at 1500 sccm and the temperature was 300° C. At 0.5 Torr, the etch rate using the AsMy coated dual channel shower head was 382 Å/minute and the etch rate of the uncoated dual channel showerhead was 115 Å/minute. The etch rate using the AsMy coated dual channel showerhead was over three times faster than the etch rate of the uncoated dual channel showerhead. At 1 Torr, the etch rate with the AsMy coated dual channel showerhead was 222 Å/minute and the etch rate of the uncoated dual channel showerhead was 82 Å/minute. The etch rate with the AsMy coated dual channel showerhead was nearly three times as fast as the etch rate with the uncoated showerhead.

Plasma sprayed AsMy coatings are flatter, have fewer cracks, and have less potential for particle contamination than other plasma sprayed coatings. Plasma sprayed AsMy coatings were compared to $Y_2O_3$ plasma sprayed coatings and to plasma sprayed coatings containing a mixture of $Y_4Al_2O_9$ and a $Y_2O_3$—$ZrO_2$ solid solution, the mixture referred to hereinafter as HPM. The porosities of HPM, $Y_2O_3$, and AsMy are about 2.5%, about 3%, and about 0.25-1.0%, respectively. The surface roughness of HPM, $Y_2O_3$, and AsMy are about 180μ-inches, about 190μ-inches, and about 150μ-inches, respectively. The adhesion strength on an aluminum substrate of HPM, $Y_2O_3$, and AsMy are 29 MPa, 18 MPa, and 30 MPa, respectively. The hardness (Vickers) of HPM, $Y_2O_3$, and AsMy are 6.6 GPa, 4.0 GPa, and 5.1 GPa, respectively. Coatings having a thickness of 8 mil (0.008 inches) were exposed to 5% hydrochloric acid and etching was evident at about 3 hours exposure on the HPM and about 4 hours on the $Y_2O_3$, while the AsMy was greater than 8 hours. Breakdown voltage on the 8 mil coating are 650 Volts/mil for HPM, 630 Volts/mil for $Y_2O_3$, and 520 Volts/mil for AsMy. The coefficient of thermal expansion (CTE) of HPM, $Y_2O_3$, and AsMy are 8.5×$10^{-6}$/K, 7.2×$10^{-6}$/K, and 6.8×$10^{-6}$/K, respectively.

Figure 3:
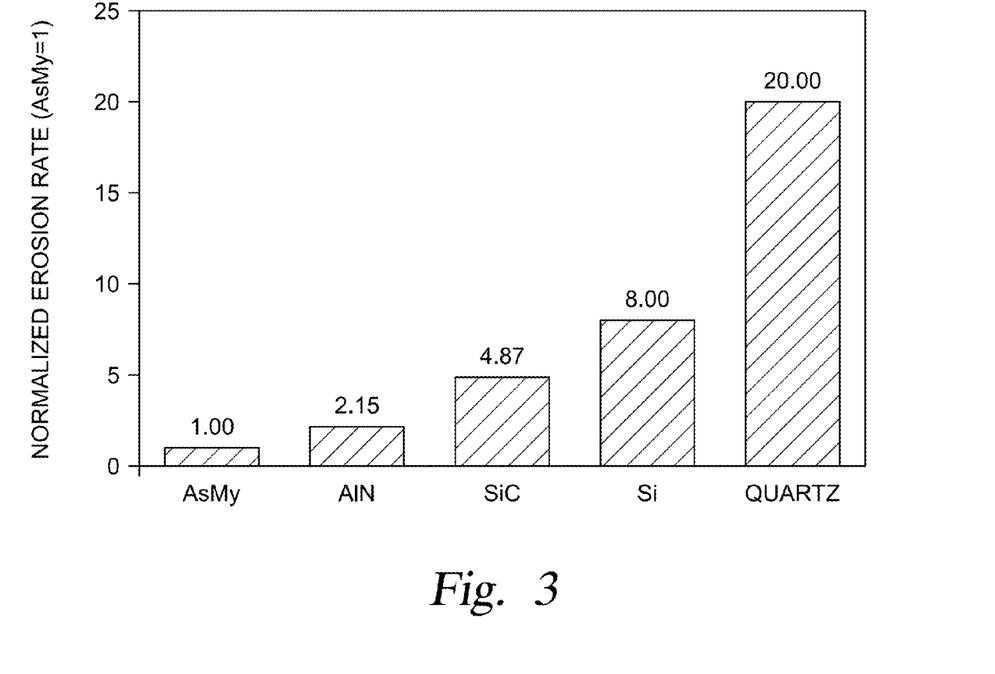
FIG. 3 is a graph comparing the plasma erosion resistance of an aluminum oxide/silicon/magnesium/yttrium coated surface with conventional processing chamber surfaces.

FIG. 3 is a graph 300 showing the superior plasma erosion resistance of AsMy compared to conventional surfaces. The surface erosion rates of surfaces containing AsMy, AlN, SiC, Si, and quartz after exposure to a fluorine plasma generated from $NH_3/NF_3$ for more than 70 hours were compared. The results illustrated in FIG. 3 are expressed in values normalized to the erosion rate of the AsMy coated surface. Quartz had an erosion rate twenty times greater that the erosion rate of AsMy; Si had an erosion rate eight times greater than AsMy; SiC had an erosion rate nearly five times greater than AsMy; and AlN had an erosion rate more than double that of AsMy. Even after exposure to an $NH_3/NF_3$ plasma for more than 70 hours, AsMy coated surfaces demonstrate no measurable defects or erosion.

Figure 4A:
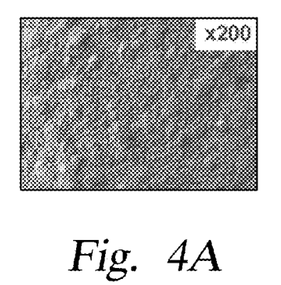
FIGS. 4A-4F are SEM images showing plasma sprayed AsMy coatings on various surfaces.
Figure 4B:
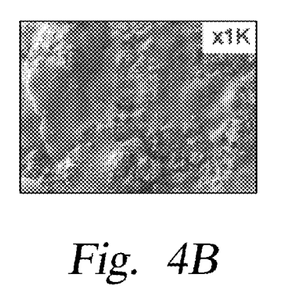
Figure 4C:
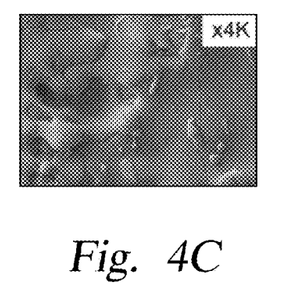
Figure 4D:
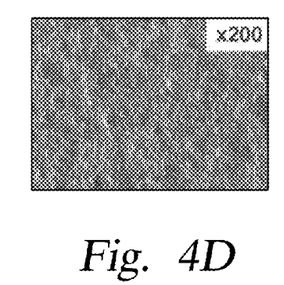
Figure 4E:
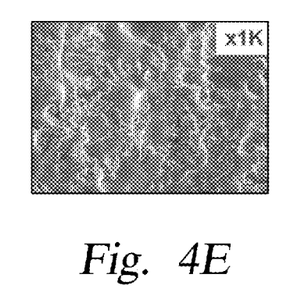
Figure 4F:
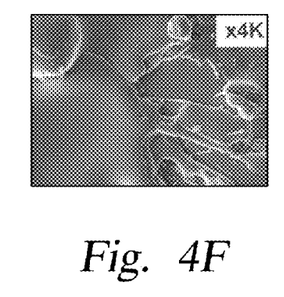
Figure 4G:
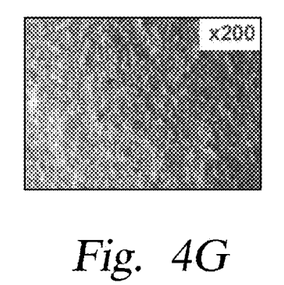
FIGS. 4G-4I are SEM images of a plasma sprayed $Y_2O_3$ coating for comparison.
Figure 4H:
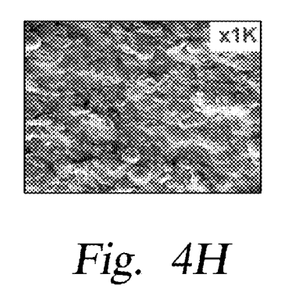
Figure 4I:
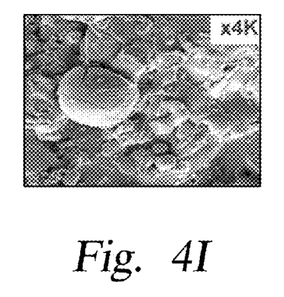

FIGS. 4A-4F are SEM images showing plasma sprayed AsMy coatings on aluminum nitride (AlN (FIGS. 4A-4C)) and aluminum (Al (FIGS. 4D-4F)) metal surfaces at various magnifications (200 times, 1,000 times and 4,000 times, respectively). For comparison, SEM images of a plasma sprayed $Y_2O_3$ coating is also shown in FIGS. 4G-4I. As shown, the AsMy coatings exhibit less cracks as compared to the $Y_2O_3$ coating. Additionally, the AsMy coatings are flatter and/or smoother than the $Y_2O_3$ coating.

Figure 5A:
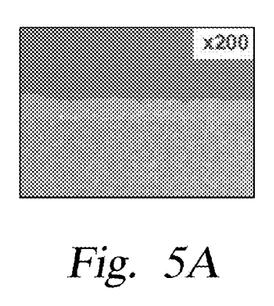
FIGS. 5A-5F are SEM images showing plasma sprayed cross-sections of AsMy coatings on various surfaces.
Figure 5B:
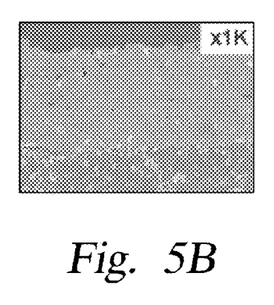
Figure 5C:
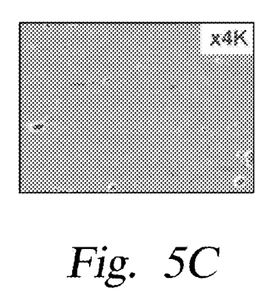
Figure 5D:
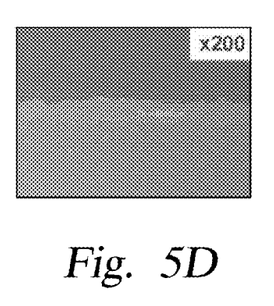
Figure 5E:
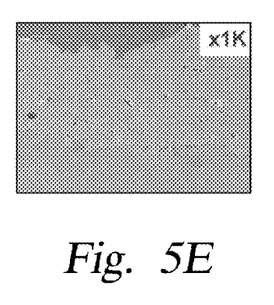
Figure 5F:
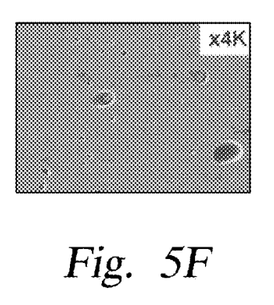
Figure 5G:
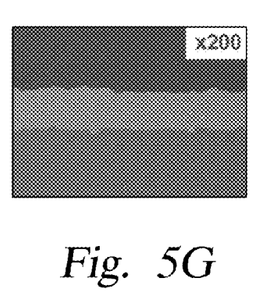
FIGS. 5G-5I are SEM cross-sectional images of a plasma sprayed $Y_2O_3$ coating for comparison.
Figure 5H:
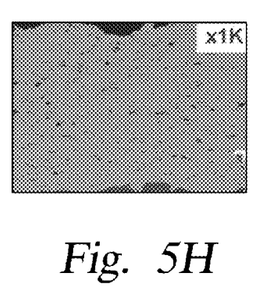
Figure 5I:
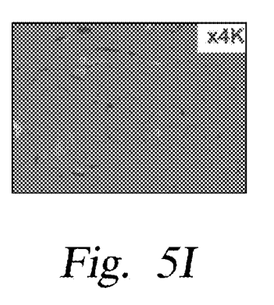

FIGS. 5A-5F are SEM images showing plasma sprayed cross-sections of AsMy coatings on AlN (FIGS. 5A-5C) and Al metal (FIGS. 5D-5F) surfaces at various magnifications (200 times, 1,000 times and 4,000 times, respectively). For comparison, SEM cross-sectional images of a plasma sprayed $Y_2O_3$ coating is also shown in FIGS. 5G-5I. As shown, the AsMy coatings exhibit less porosity as compared to the $Y_2O_3$ coating.

FIGS. 6A-6I and 7A-7I are SEM images depicting properties of plasma sprayed AsMy coatings on aluminum metal surfaces after being thermally treated.

Figure 6A:
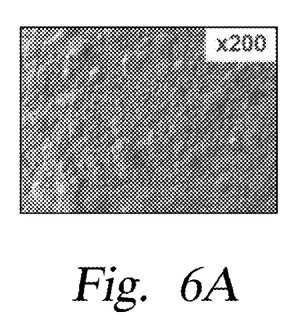
FIGS. 6A-6I are SEM images showing AsMy coatings on aluminum metal surfaces at various magnifications.
Figure 6B:
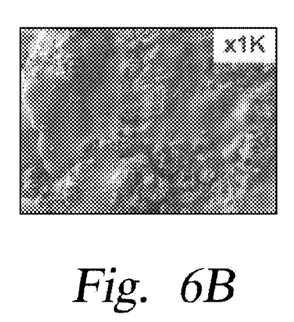
Figure 6C:
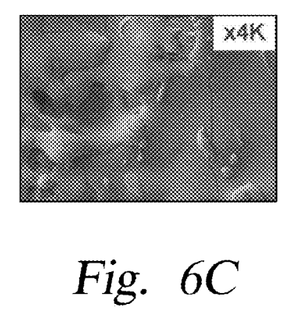
Figure 6D:
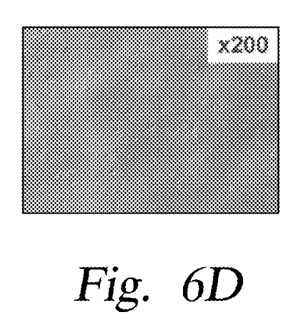
Figure 6E:
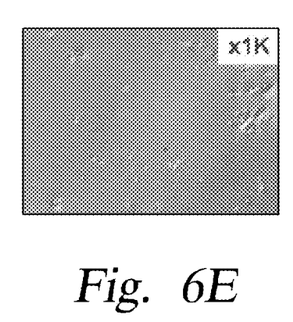
Figure 6F:
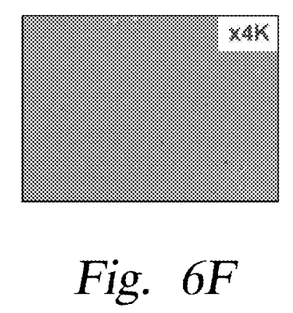
Figure 6G:
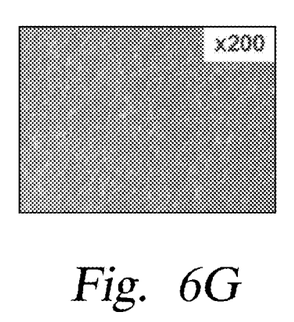
Figure 6H:
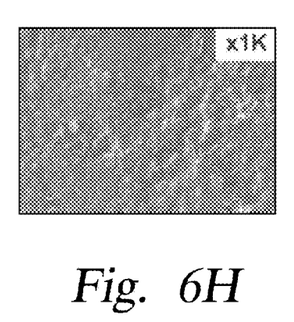
Figure 6I:
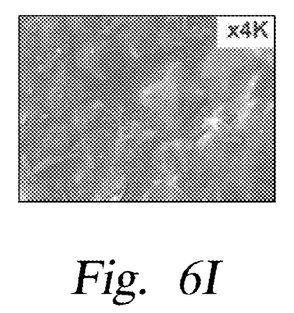

FIGS. 6A-6I are SEM images showing AsMy coatings on aluminum metal surfaces at various magnifications (200 times, 1,000 times and 4,000 times, respectively). FIGS. 6A-6C shows the AsMy coating as-sprayed, FIGS. 6D-6F shows an AsMy coating treated at 900 degrees Celsius, and FIGS. 6G-6I shows an AsMy coating treated at 1,100 degrees Celsius. As shown, the thermal treatment improves surface morphology of the AsMy coating.

Figure 7A:
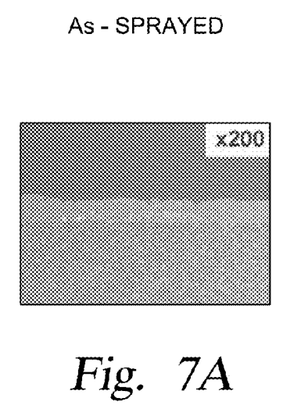
FIGS. 7A-7I are SEM images showing cross-sections of AsMy coatings on aluminum metal surfaces at various magnifications.
Figure 7B:
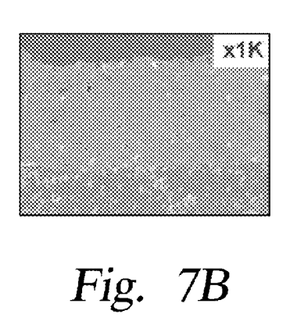
Figure 7C:
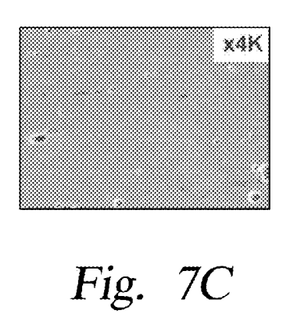
Figure 7D:
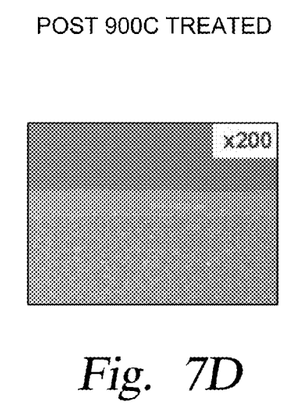
Figure 7E:
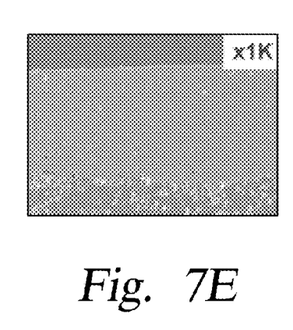
Figure 7F:
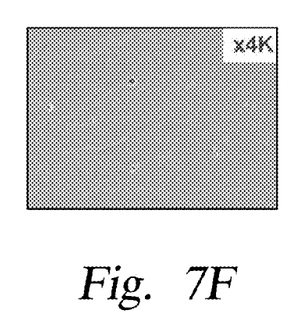
Figure 7G:
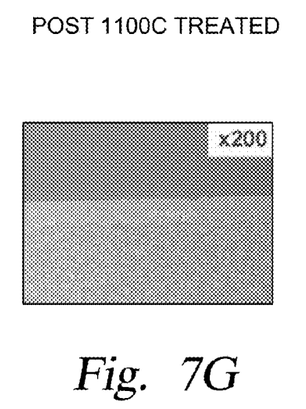
Figure 7H:
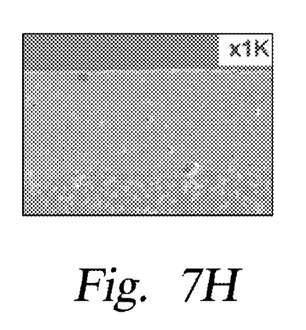
Figure 7I:
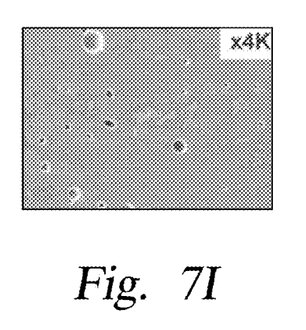

FIGS. 7A-7I are SEM images showing cross-sections of AsMy coatings on aluminum metal surfaces at various magnifications (200 times, 1,000 times and 4,000 times, respectively). FIGS. 7A-7C shows the AsMy coating as-sprayed, FIGS. 7D-7F shows an AsMy coating treated at 900 degrees Celsius, and FIGS. 7G-7I shows an AsMy coating treated at 1,100 degrees Celsius. As shown, the thermal treatment improves the quality of the AsMy coating.

Figure 8:
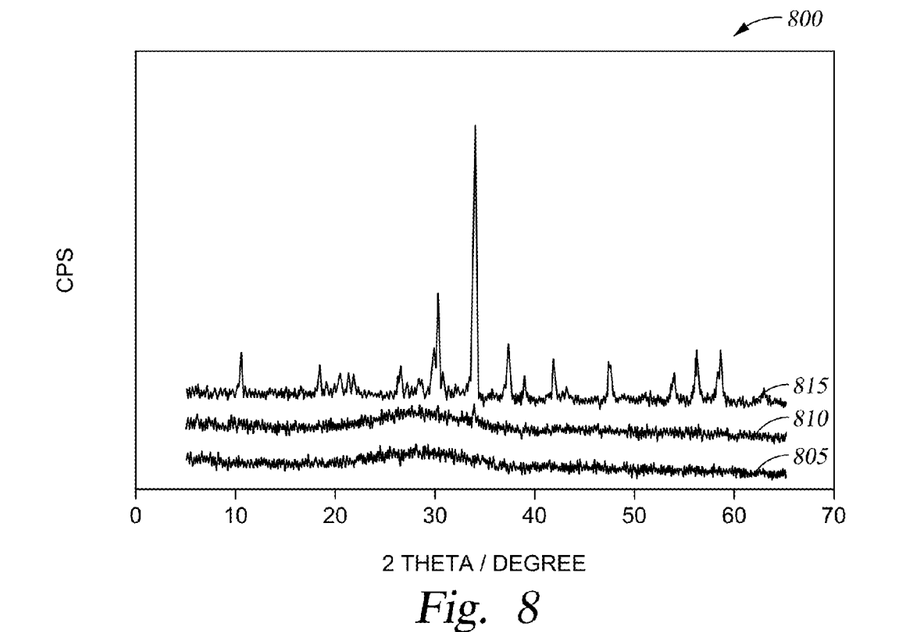
FIG. 8 is a graph showing diffraction patterns of AsMy coatings using an x-ray diffraction (XRD) technique.

FIG. 8 is a graph 800 showing diffraction patterns of AsMy coatings using an x-ray diffraction (XRD) technique. The abscissa represents the angle of the detected rays and the ordinate represents counts per second (CPS). Curve 805 shows diffraction patterns of an as-sprayed AsMy coating. Curve 810 shows diffraction patterns of an AsMy coating that has been thermally treated at 900 degrees Celsius. Curve 815 shows diffraction patterns of an AsMy coating that has been thermally treated at 1,100 degrees Celsius. As shown, the as-sprayed AsMy coating as well as the AsMy coating treated at 900 degrees Celsius remains amorphous while the AsMy coating treated at 1,100 degrees Celsius includes some crystallinity. While the AsMy coatings have been found to be more stable in plasma environments as compared to conventional materials, the amorphous and crystalline versions may be better suited for specific plasma environments. For example, the amorphous AsMy coatings (curves 805 and 810) may be beneficial for use in hydrogen plasma environments while the crystalline AsMy coating (curve 815) may be beneficial for use in fluorine plasma environments due to the crystal structure which enhances stability.

Figure 9A:
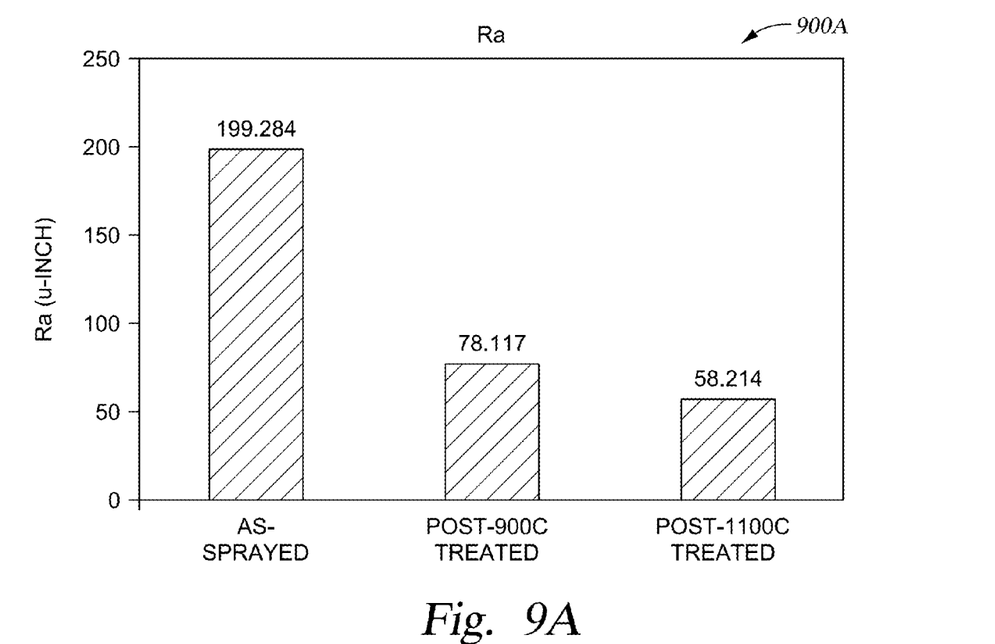
FIGS. 9A and 9B are graphs showing surface roughness of various AsMy coatings.
Figure 9B:
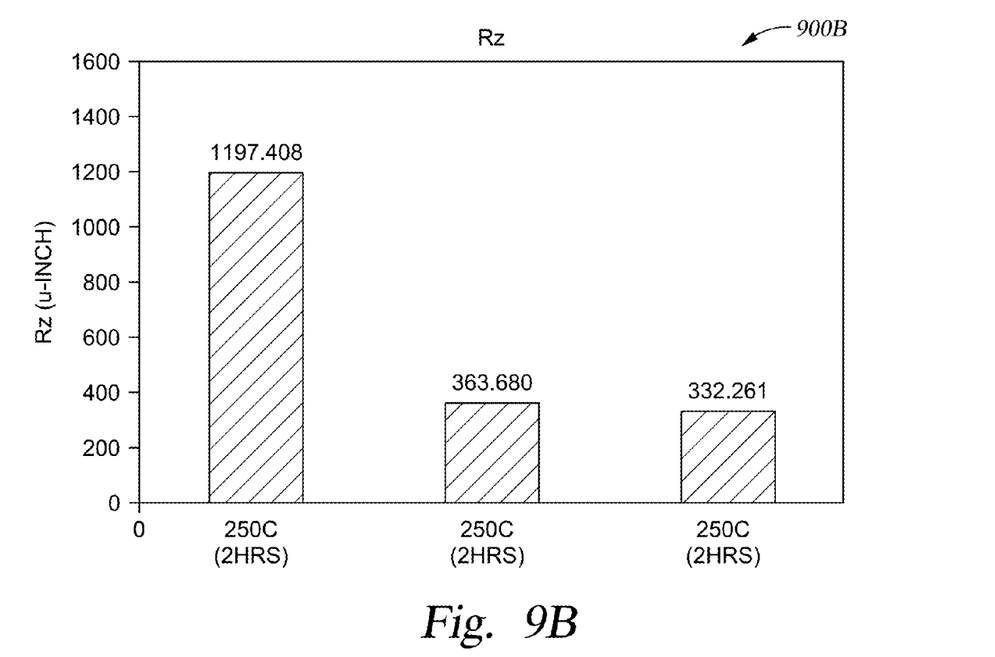

FIGS. 9A and 9B are graphs 900A and 900B, respectively, showing surface roughness of various AsMy coatings. Graph 900A shows average surface roughness (Ra) and graph 900B shows the mean roughness depth (Rz) of an as-sprayed AsMy coating, an AsMy coating treated at 900 degrees Celsius, and an AsMy coating treated at 1,100 degrees Celsius. As shown, thermal treatment of the AsMy coating significantly reduces surface roughness (i.e., about three times reduction).

Figure 10A:
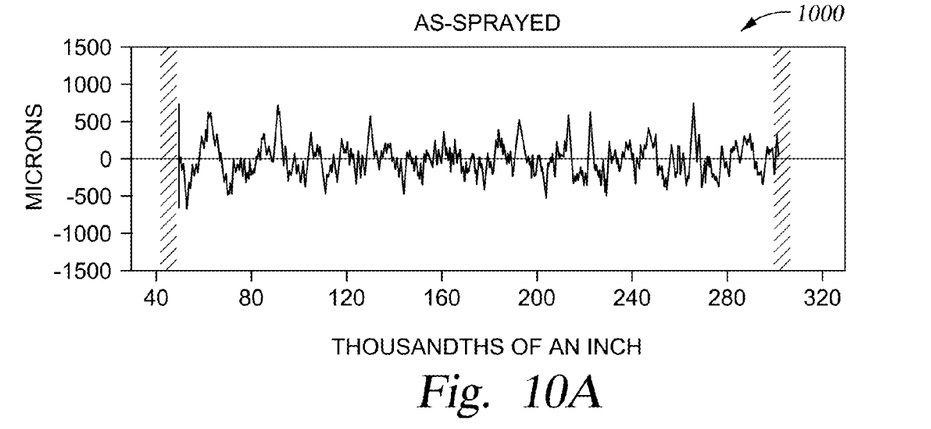
FIGS. 10A-10C are graphs showing surface profiles of various AsMy coatings.
Figure 10B:
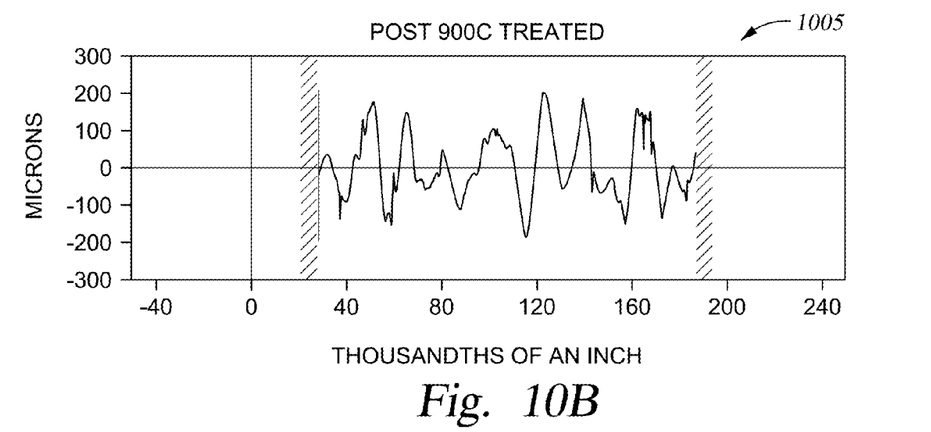
Figure 10C:
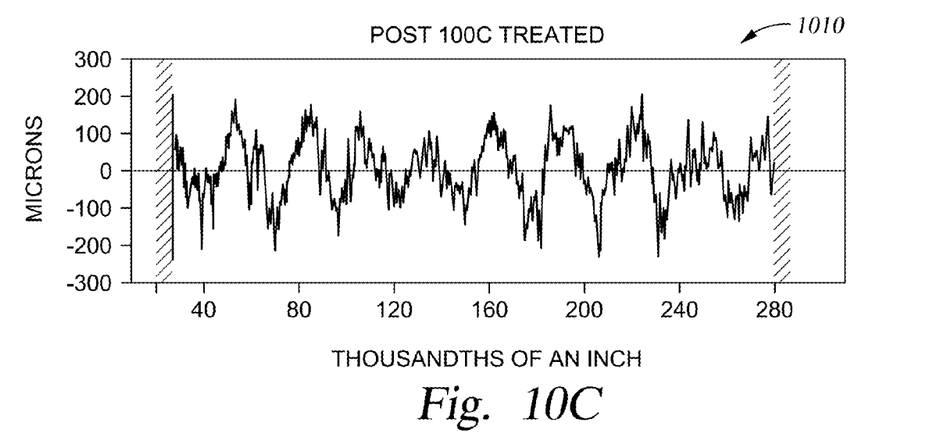

FIGS. 10A-10C are graphs 1000, 1005 and 1010, respectively, showing surface profiles of various AsMy coatings. Graph 1000 shows an as-sprayed AsMy coating. Graph 1005 shows an AsMy coating treated at 900 degrees Celsius. Graph 1010 shows an AsMy coating treated at 1,100 degrees Celsius. As shown, the AsMy coating treated at 900 degrees Celsius and the AsMy coating treated at 1,100 degrees Celsius is significantly smoother than the as-sprayed AsMy coating. While the AsMy coatings shown in graphs 1005 and 1010 are similar, the AsMy coating treated at 1,100 degrees Celsius has more small peaks attached to the larger peaks as compared to the AsMy coating treated at 900 degrees Celsius. This is believed to be the effect of crystallization of the AsMy coating treated at 1,100 degrees Celsius.

Figure 11A:
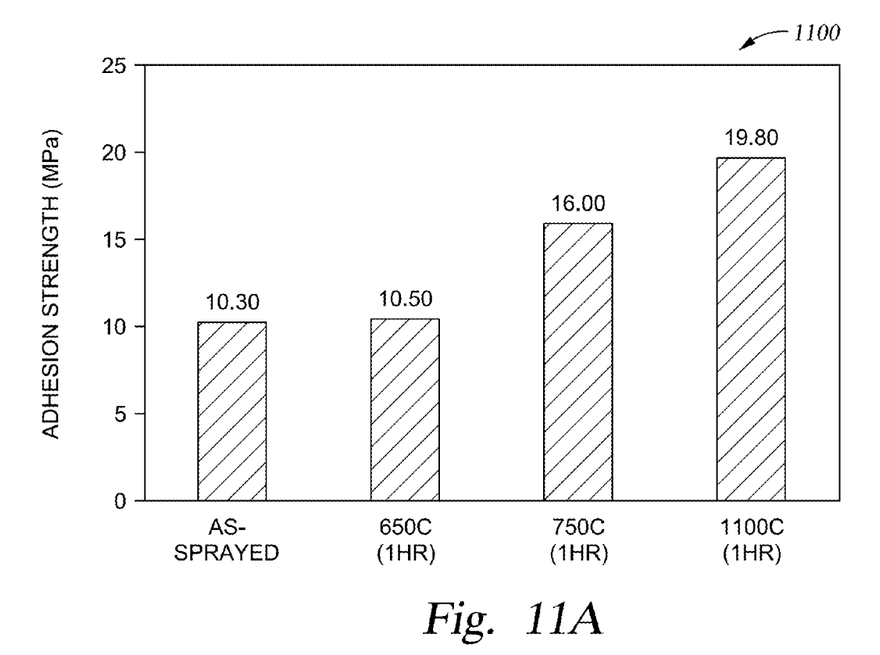
FIGS. 11A and 11B are graphs showing adhesion strength improvement of an AsMy coating by heat treatment, as compared to an as-sprayed AsMy coating.
Figure 11B:
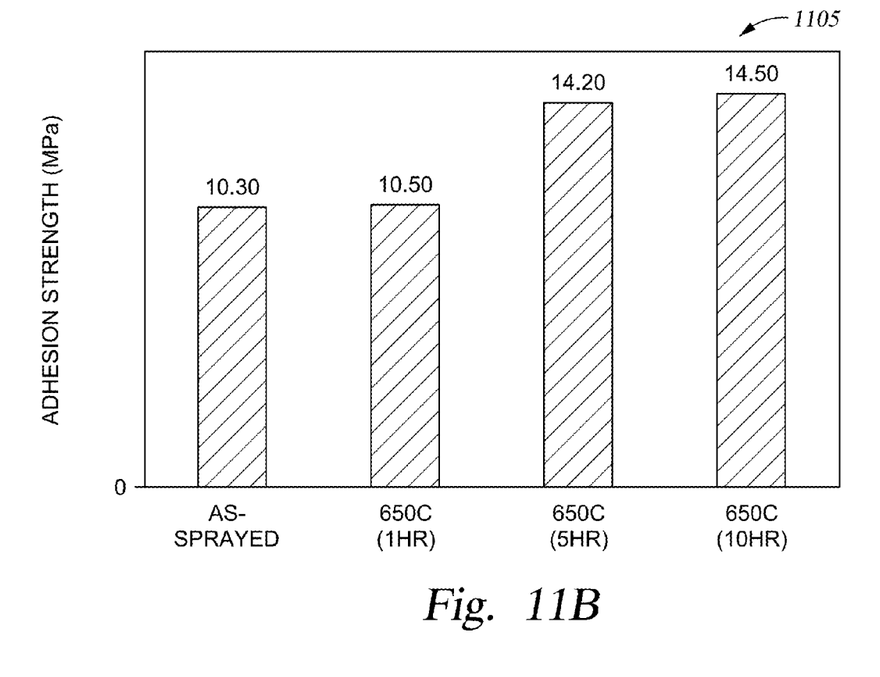

FIGS. 11A and 11B are graphs 1100 and 1105, respectively, showing adhesion strength improvement of an AsMy coating by heat treatment, as compared to an as-sprayed AsMy coating. In this example, the AsMy coating was applied to an AlN substrate. The coated substrate was loaded into a furnace and heated to the indicated temperatures at a rate of 0.5 degrees Celsius per minute. The temperatures were held for the times indicated in the graphs 1100 and 1105. Thereafter, the coated substrate was removed from the furnace when the furnace temperature was less than 80 degrees Celsius. Thermal treatment is shown to improve adhesion strength significantly, while longer treatment time stabilizes adhesion strength.

Figure 12:
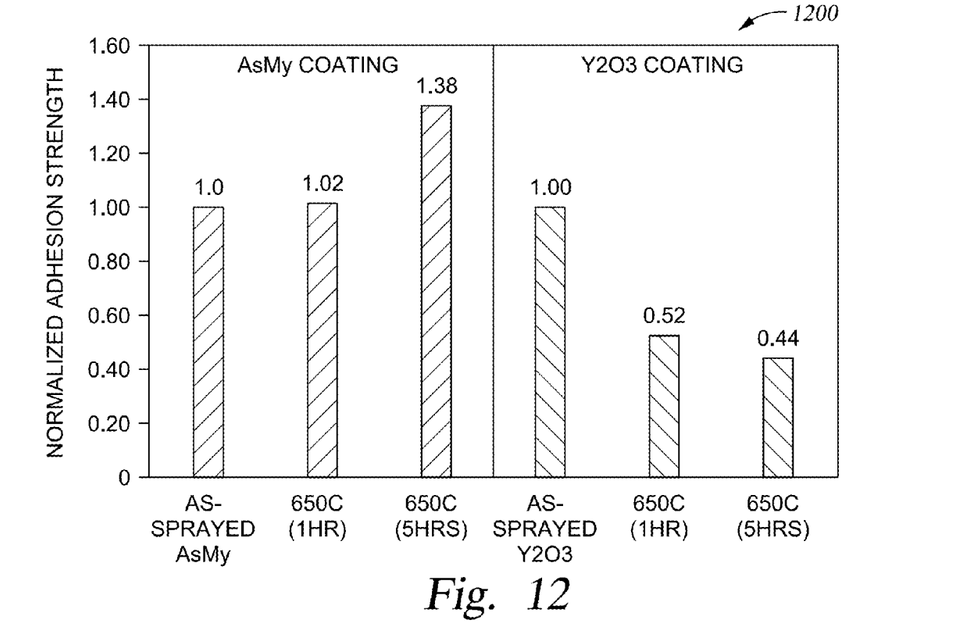
FIG. 12 is a graph showing adhesion strength differences in a plasma sprayed AsMy coating and a plasma sprayed $Y_2O_3$ coating.

FIG. 12 is a graph 1200 showing adhesion strength differences in a plasma sprayed AsMy coating and a plasma sprayed $Y_2O_3$ coating. As can be seen, thermal treatment improved the adhesion strength of the AsMy coating, but reduced the adhesion strength of the $Y_2O_3$ coating.

Figure 13:
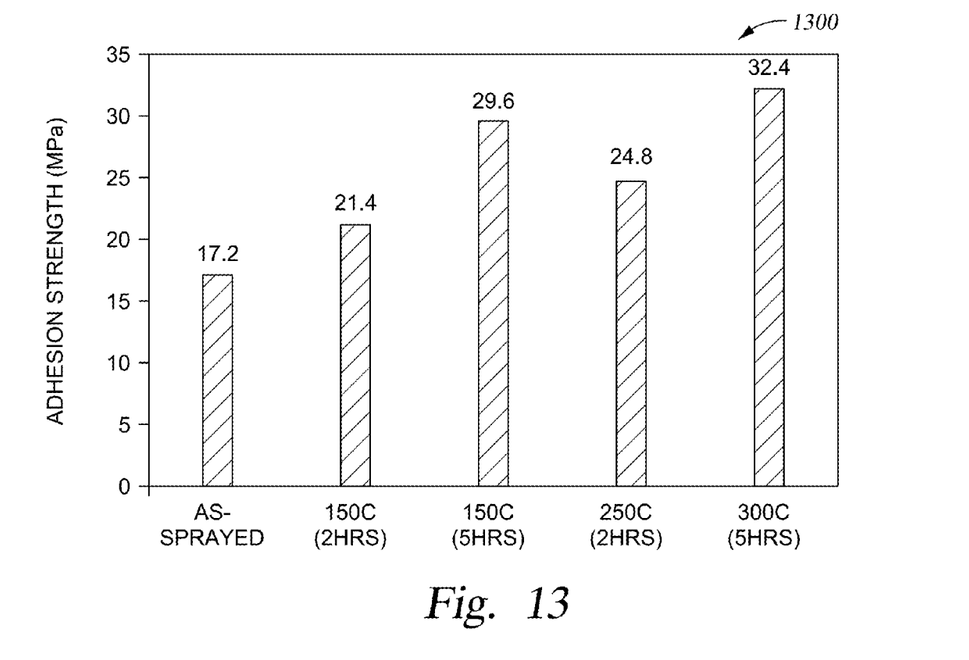
FIG. 13 is a graph showing adhesion strength improvement of an AsMy coating by heat treatment, as compared to an as-sprayed AsMy coating.

FIG. 13 is a graph 1300 showing adhesion strength improvement of an AsMy coating by heat treatment, as compared to an as-sprayed AsMy coating. In this example, the AsMy coating was applied to an Al substrate. The coated substrate was loaded into a furnace and heated to the indicated temperatures for the times indicated on the graph 1300. Thereafter, the coated substrate was removed from the furnace when the furnace temperature was less than 80 degrees Celsius. Thermal treatment is shown to improve adhesion strength significantly, and up to two times greater at 300 degrees Celsius.

In some embodiments, the AsMy coating as described herein may be transparent to optical energy. In one example, an AsMy coating may be formed as a transparent glass material utilizing 29.0 weight percent $Y_2O_3$ powder (10.3 molar percent); 19.3 weight percent $Al_2O_3$ powder (15.1 molar percent); 42.6 weight percent $SiO_2$ (56.8 molar percent); and 9.1 weight percent MgO (18.0 molar percent). The transmittance of light at a wavelength of 250 nm through a one millimeter thick sample of the AsMy coating is about 78 percent. Table 2 illustrates the properties of this specific composition of AsMy relative to the properties of pure $Y_2O_3$ and quartz.

TABLE 2

| Material Property | $Y_2O_3$ | Quartz | AsMy |
|---|---|---|---|
| Density (g/cm$^3$) | 4.90 | 2.20 | 3.10 |
| Flexural Strength (MPa) | 110 | 35 | 104 |
| Vickers Hardness (5 Kgf) (GPa) | 6.0 | 4.6 | 7.1 |
| Fracture Toughness (MPa · m$^{1/2}$) | 1.2 | 0.8 | 1.2 |
| Young's Modulus (GPa) | 160 | 72 | 113 |
| Thermal Expansion × 10$^{-6}$/K (20~900° C.) | 7.8 | 0.5 | 6.8 |
| Thermal Conductivity (W/mK) | 14 | 1.5 | 1.3 |
| Dielectric Constant (20° C., 13.56 MHz) | 12.5 | 3.6 | 8.2 |
| Dielectric Loss Tangent × 10$^{-4}$ (20° C., 13.56 MHz) | <10 | 2 | 30 |
| Dielectric Strength (kV/mm) | 10 | 13 | 12 |
| Volume Resistivity (at 23° C.) (Ohm-cm) | >10$^{15}$ | >10$^{15}$ | >10$^{15}$ |

Figure 14:
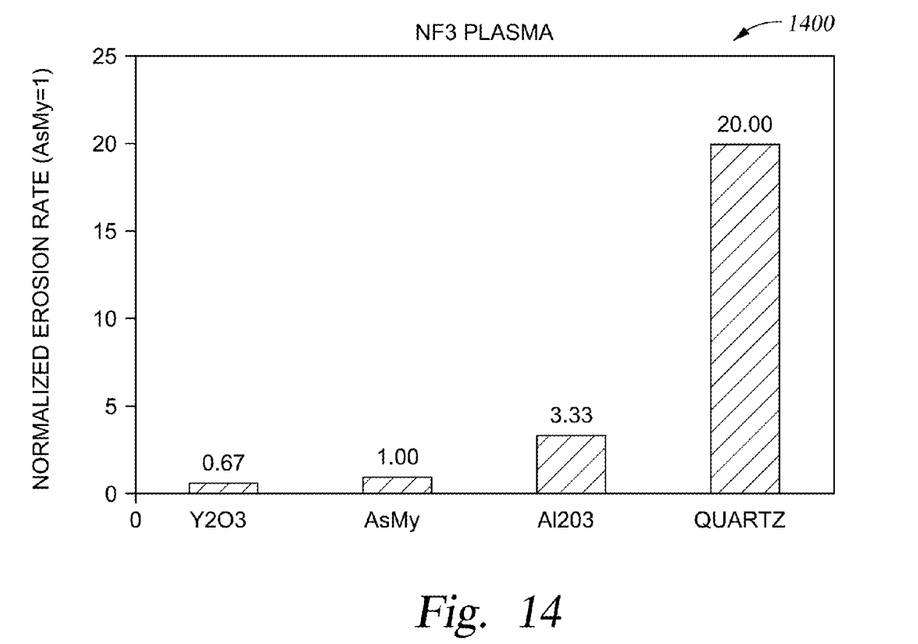
FIG. 14 is a graph illustrating the erosion rates of materials relative to the plasma sprayed AsMy coating as described herein when exposed to $NF_3$ plasma.

FIG. 14 is a graph 1400 illustrating the erosion rates of materials relative to the plasma sprayed AsMy coating as described herein when exposed to $NF_3$ plasma. Each of a $Y_2O_3$ substrate, an AsMy substrate, an alumina ($Al_2O_3$) substrate and a quartz substrate were exposed for five hours to 500 sccm of $NF_3$ gas ignited into a plasma at conditions of 400 degrees Celsius and 2.8 Torr. It was found that the AsMy coating erodes at a rate slightly greater than a $Y_2O_3$ coating, but much less than the erosion rates of quartz and alumina. However, it is to be noted that pure crystalline yttrium oxide, while offering good corrosion resistance to various etchant plasmas, does not offer a viable commercial option as an optically transparent window or showerhead in a chamber application using thermal energy in infra-red (IR) or ultra violet wavelength ranges to heat substrates. While $Y_2O_3$ can be transparent, the size or thickness of transparent $Y_2O_3$ is limited, and thus has limited applications. Moreover, transparent $Y_2O_3$ is relatively expensive. Therefore, $Y_2O_3$ can be undesirable for use in processing chambers in some instances.

While the foregoing is directed to embodiments of the present disclosure, other and further embodiments may be devised without departing from the basic scope thereof, and the scope thereof is determined by the claims that follow.

The invention claimed is:

1. A processing chamber wherein at least one surface of the processing chamber has a coating comprising $Si_vY_wMg_xAl_yO_z$, wherein
    v ranges from about 0.0196 to 0.2951;
    w ranges from about 0.0131 to 0.1569;
    x ranges from about 0.0164 to 0.0784;
    y ranges from about 0.0197 to 0.1569;
    z ranges from about 0.5882 to 0.6557; and
    v+w+x+y+z=1, wherein the coating has a porosity of about 0.25% to about 1.0%.

2. The processing chamber of claim 1, the coating has a chemical formula comprising $Si_{0.171}Y_{0.062}Mg_{0.054}Al_{0.090}O_{0.623}$.

3. A processing chamber wherein at least one surface of the processing chamber has a coating comprising $Si_vY_wMg_xAl_yO_z$, wherein:
    v ranges from about 0.0196 to 0.2951;
    w ranges from about 0.0131 to 0.1569;
    x ranges from about 0.0164 to 0.0784;
    y ranges from about 0.0197 to 0.1569;
    z ranges from about 0.5882 to 0.6557; and
    v+w+x+y+z=1, wherein the coating is a glass or a glass-ceramic.

4. The processing chamber of claim 3, wherein the coating has a thickness of about 20 microns to about 300 microns.

5. The processing chamber of claim 1, wherein the at least one surface of the processing chamber is selected from the group consisting of chamber body sidewall surfaces, dome side wall surfaces, gas distribution showerhead surfaces, baffle surfaces, blocker plate surfaces, gas feed block surfaces, remote plasma source bracket surfaces, centering ring surfaces, remote plasma conduit surfaces, and choker surfaces.

6. A composition of matter having a molecular structure comprising $Si_vY_wMg_xAl_yO_z$, wherein
    v ranges from about 0.0196 to 0.2951;
    w ranges from about 0.0131 to 0.1569;
    x ranges from about 0.0164 to 0.0784;
    y ranges from about 0.0197 to 0.1569;
    z ranges from about 0.5882 to 0.6557; and
    v+w+x+y+z=1, wherein the composition of matter is a glass or a glass-ceramic.

7. The composition of matter of claim 6, further comprising a binder.

8. The composition of matter of claim 6, wherein the chemical formula is $Si_{0.171}Y_{0.062}Mg_{0.054}Al_{0.090}O_{0.623}$.

9. A composition of matter having a molecular structure comprising $Si_vY_wMg_xAl_yO_z$, wherein:
    v ranges from about 0.0196 to 0.2951;
    w ranges from about 0.0131 to 0.1569;
    x ranges from about 0.0164 to 0.0784;
    y ranges from about 0.0197 to 0.1569;
    z ranges from about 0.5882 to 0.6557; and
    v+w+x+y+z=1, wherein the composition of matter is amorphous.

10. A composition of matter having a molecular structure comprising $Si_vY_wMg_xAl_yO_z$, wherein:
    v ranges from about 0.0196 to 0.2951;
    w ranges from about 0.0131 to 0.1569;
    x ranges from about 0.0164 to 0.0784;
    y ranges from about 0.0197 to 0.1569;
    z ranges from about 0.5882 to 0.6557; and
    v+w+x+y+z=1, wherein the coating is transparent to optical energy.

11. The composition of matter of claim 10, wherein the composition of matter is crystalline.

12. A method of processing a substrate, the method comprising:
    generating a plasma or radicals inside a processing chamber or introducing a plasma or radicals into a processing chamber, wherein the processing chamber has at least one surface coated with $Si_vY_wMg_xAl_yO_z$, wherein:
    v ranges from about 0.0196 to 0.2951;
    w ranges from about 0.0131 to 0.1569;
    x ranges from about 0.0164 to 0.0784;
    y ranges from about 0.0197 to 0.1569;
    z ranges from about 0.5882 to 0.6557; and
    v+w+x+y+z=1, wherein the coating is a glass or a glass-ceramic.

13. The method of claim 12, wherein the coating has a chemical formula comprising $Si_{0.171}Y_{0.062}Mg_{0.054}Al_{0.090}O_{0.623}$.

14. The method of claim 13, wherein the coating has a thickness of 20 to about 300 μm.

15. The method of claim 12, wherein the at least one surface includes at least one surface configured to contact radicals, plasma, or both during the operation of the processing chamber.

16. The method of claim 12, wherein the coating is heat treated to at least about 900 degrees Celsius.

17. The method of claim 12, wherein the coating is heat treated to at least about 1,100 degrees Celsius.

* * * * *